(12) United States Patent
Shen et al.

(10) Patent No.: US 8,222,662 B2
(45) Date of Patent: Jul. 17, 2012

(54) LED PACKAGE STRUCTURE

(75) Inventors: Chia-Hui Shen, Hsinchu Hsien (TW);
Tzu-Chien Hung, Hsinchu Hsien (TW);
Jian-Shihn Tsang, Hsinchu Hsien (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 19 days.

(21) Appl. No.: 12/975,232

(22) Filed: Dec. 21, 2010

(65) Prior Publication Data
US 2012/0012872 A1  Jan. 19, 2012

(30) Foreign Application Priority Data
Jul. 15, 2010 (CN) .......................... 2010 1 0227947

(51) Int. Cl.
*H01L 33/00* (2010.01)
(52) U.S. Cl. ................ 257/98; 438/29; 438/42; 438/43; 257/99; 257/100
(58) Field of Classification Search ............. 257/98, 257/99, 100; 438/20, 22, 24, 29, 46, 47, 438/48, 51, 55, 64, 93, 94, 106, 107, 108, 438/109, 110, 112
See application file for complete search history.

(56) References Cited

U.S. PATENT DOCUMENTS

| | | | | |
|---|---|---|---|---|
| 5,813,753 | A * | 9/1998 | Vriens et al. .................. | 362/293 |
| 6,703,780 | B2 * | 3/2004 | Shiang et al. ................. | 313/504 |
| 6,964,877 | B2 * | 11/2005 | Chen et al. ..................... | 438/20 |
| 7,183,577 | B2 * | 2/2007 | Mueller-Mach et al. ....... | 257/79 |
| 7,382,091 | B2 * | 6/2008 | Chen et al. .................... | 313/512 |
| 7,728,344 | B2 * | 6/2010 | Chang et al. ................... | 257/98 |
| 8,080,828 | B2 * | 12/2011 | Krames et al. ................. | 257/98 |
| 2008/0211993 | A1 * | 9/2008 | Toyama et al. ................ | 349/69 |
| 2009/0152582 | A1 * | 6/2009 | Chang et al. ................... | 257/98 |
| 2011/0012157 | A1 * | 1/2011 | Shi ................................. | 257/98 |

* cited by examiner

*Primary Examiner* — Jarrett Stark
*Assistant Examiner* — John M Parker
(74) *Attorney, Agent, or Firm* — Altis Law Group, Inc.

(57) ABSTRACT

An LED package structure includes a transparent substrate having a supporting face and a light-emergent face opposite to the supporting face, a housing disposed on the supporting face, two electrodes disposed on the housing, an LED chip disposed on the supporting face and electrically connected to the two electrodes, a reflecting layer covering the LED chip to reflect light emitted by the LED chip toward the transparent substrate, and a phosphor layer formed on the light-emergent face of the substrate. The phosphor layer includes a plurality of layers each having a specific light wavelength conversion range to generate a light with a predetermined color.

14 Claims, 2 Drawing Sheets

LED PACKAGE STRUCTURE

BACKGROUND

1. Technical Field

The present disclosure relates to an optical component, and particularly, to a light emitting diode (LED) package structure.

2. Description of Related Art

Presently, LEDs are preferred for use in non-emissive display devices than CCFLs (cold cathode fluorescent lamp) due to their high brightness, long lifespan, and wide color range. A typical LED package structure includes a substrate, an LED chip disposed on the substrate and an encapsulation material encapsulating the LED chip. The encapsulation material includes a resin and various phosphorous compounds doped within the resin, which can turn portions of light emitted from the LED chip into desired color. However, as various phosphorous compounds are mixed together, they would generate light with different wavelengths interfering each other, thereby decreasing the light-emitting efficiency of the LED package structure.

Accordingly, it is desirable to provide an LED package structure which can overcome the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Figure 1:
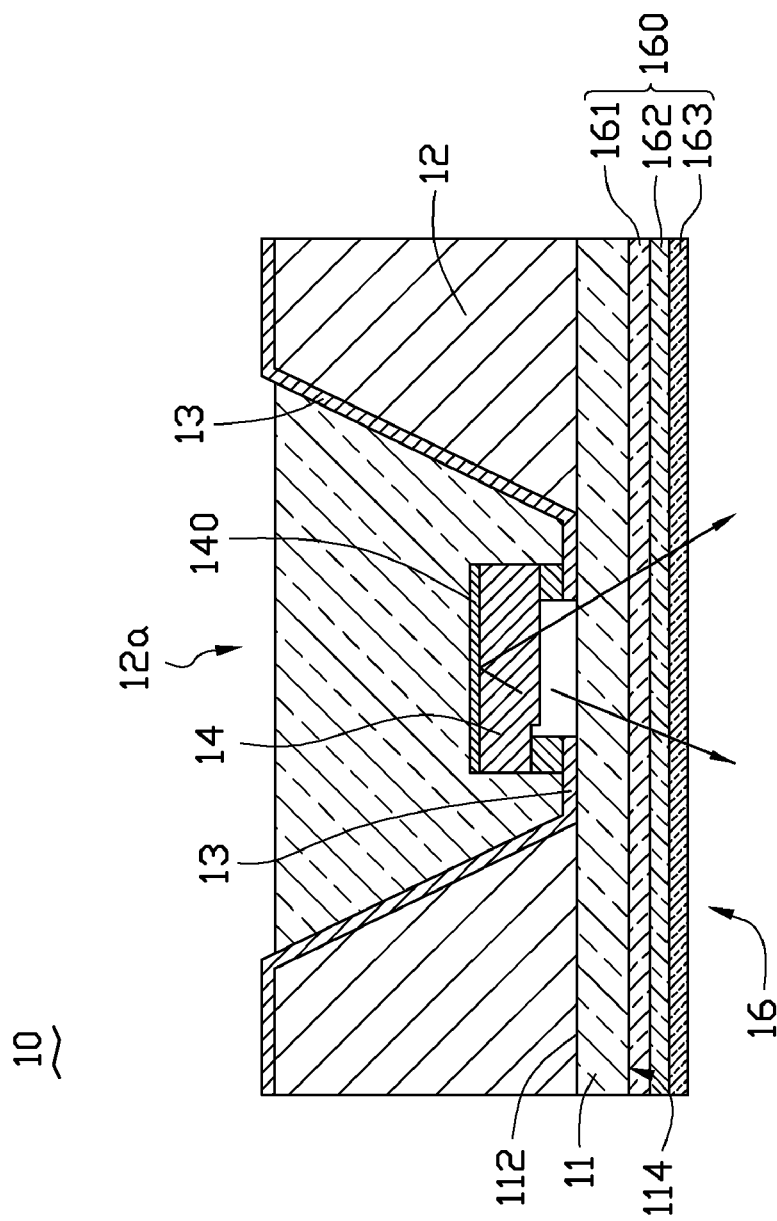
FIG. 1 is a cross-sectional view of an LED package structure according to a first embodiment of the present disclosure.

Referring to FIG. 1, a light emitting diode (LED) package structure 10 in accordance with a first embodiment of the disclosure is illustrated. The LED package structure 10 is a flip-chip LED package structure, and comprises a substrate 11, a housing 12, two electrodes 13, and an LED chip 14.

The substrate 11 is a transparent flat layer, for allowing light emitted by the LED chip 14 passing therethrough. The substrate 11 has a supporting face 112 and a light-emergent face 114 opposite to the supporting face 112. The housing 12 and the two electrodes 13 are disposed on the supporting face 112. A phosphor layer 16 is further provided to spread on the light-emergent face 114. The substrate 11 is made of material with high light permeability, such as silicon dioxide, silicon nitride, diamond, diamond-like material, sapphire, polymer material or quartz.

The housing 12 is formed on the supporting face 112 of the substrate 11. A downwardly tapered receiving portion 12a is defined at a center of the housing 12. The receiving portion 12a extends through the housing 12, whereby a part of the supporting face 112 is exposed via the receiving portion 12a. The housing 12 has a good capability of heat dissipation, and is made of material selected from aluminum nitride, silicon, boron nitride or graphite. The receiving portion 12a has a periphery surrounding the LED chip 14. The two electrodes 13 are attached on the housing 12. The two electrodes 13 are spaced from and disposed opposite to each other. Each of the two electrodes 13 extends from a top face of the housing 12, along the periphery of the receiving portion 12a and to the supporting face 112 of the substrate 11. The electrodes 13 are made of material selected from aluminum, gold, copper, nickel or indium tin dioxide.

The LED chip 14 is received in the receiving portion 12a, and disposed on the supporting face 112 of the substrate 11. The LED chip 14 is electrically connected to the two electrodes 13. A reflecting layer 140 is further provided to cover a top portion of the LED chip 14, whereby light emitted by the LED chip 14 can be reflected downwardly toward the transparent substrate 11. The reflecting layer 140 is formed on the LED chip 14 by attachment, electroplating deposition, sputtering deposition or evaporation deposition. The reflecting layer 140 is made of material selected from gold, titanium, chrome, silver, aluminum, or an alloy thereof.

The phosphor layer 16, which has a structure of a film is formed on the light-emergent face 114 of the substrate 11 by attachment or coating. The phosphor layer 16 is a multilayer structure, and comprises a plurality of layers 160 each having a specific light wavelength conversion range to emit a light with a predetermined color. The values of the wavelength of the lights emitted by the layers 160 gradually decrease along a direction away from the substrate 11. In the embodiment of this disclosure, the phosphor layer 16 comprises a first layer 161 formed on the light-emergent face 114, a second layer 162 formed on the first layer 161, and a third layer 163 formed on the second layer 162. The first layer 161 has first phosphorous compound therein whereby the first layer 161 emits red light, the second layer 162 has second phosphorous compound therein whereby the second layer 162 emits green light, and the third layer 163 has third phosphorous compound therein whereby the third layer 163 emits blue light.

Figure 2:
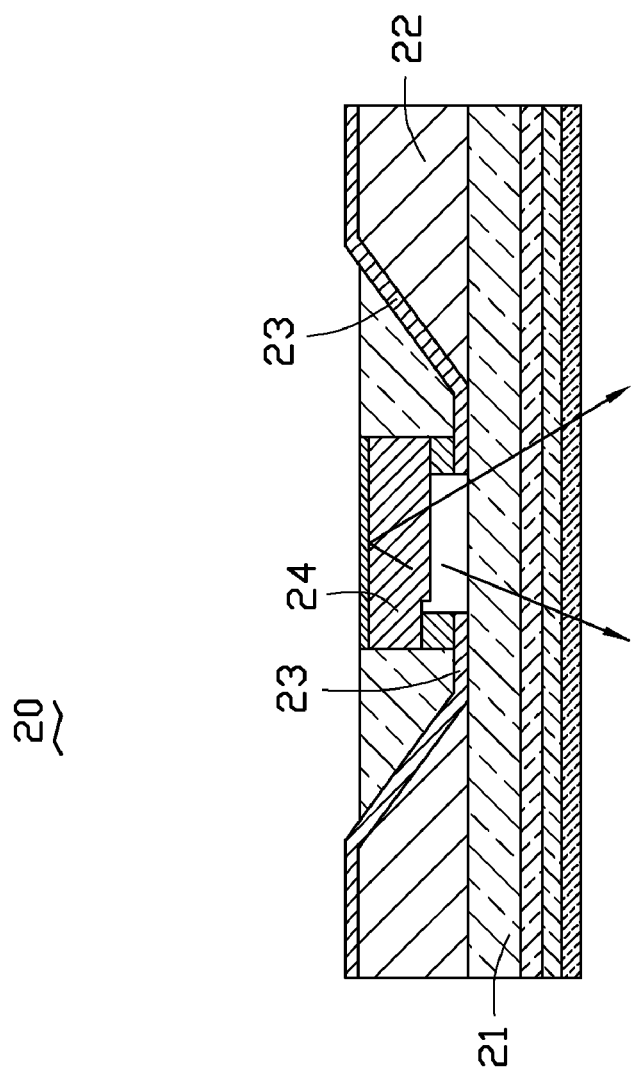
FIG. 2 is a cross-sectional view of an LED package structure according to a second embodiment of the present disclosure.

Referring to FIG. 2, an LED package structure 20 in accordance with a second embodiment of this disclosure is shown. The LED package structure 20 is mostly similar to the LED package structure 10, and comprises a substrate 21, a housing 22, two electrodes 23, and an LED chip 24. In the second embodiment of this disclosure, a height of the housing 22 is equal to that of the LED chip 24, whereby the LED package structure 20 is more compact and has a low profile.

It is to be understood, however, that even though numerous characteristics and advantages of the present embodiments have been set fourth in the foregoing description, together with details of the structures and functions of the embodiments, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A light emitting diode (LED) package structure, comprising:
 a transparent substrate having a supporting face and a light-emergent face opposite to the supporting face;
 a housing disposed on the supporting face;
 two electrodes disposed on the housing;
 an LED chip disposed on the supporting face and electrically connected to the two electrodes;
 a reflecting layer covering the LED chip to reflect light emitted by the LED chip toward the transparent substrate; and
 a phosphor layer formed on the light-emergent face of the substrate, wherein the phosphor layer comprises a plurality of layers each having a specific light wavelength conversion range to emit a light with a predetermined color.

2. The LED package structure as described in claim 1, wherein the substrate is made of material selected from one of silicon dioxide, silicon nitride, diamond, diamond-like material, sapphire, polymer material and quartz.

3. The LED package structure as described in claim 1, wherein the substrate is a flat layer.

4. The LED package structure as described in claim 1, wherein a receiving portion is defined at a center of the housing for receiving the LED chip therein.

5. The LED package structure as described in claim 4, wherein the receiving portion extends through the housing, whereby a part of the supporting face is exposed via the receiving portion.

6. The LED package structure as described in claim 1, wherein the receiving portion has a periphery surrounding the LED chip.

7. The LED package structure as described in claim 6, wherein each of the two electrodes extends from a top face of the housing along the periphery of the receiving portion to the supporting face of the substrate.

8. The LED package structure as described in claim 1, wherein the housing is made of material selected from one of aluminum nitride, silicon, boron nitride and graphite.

9. The LED package structure as described in claim 1, wherein the electrodes are made from materials selected from aluminum, gold, copper, nickel, and indium tin dioxide.

10. The LED package structure as described in claim 1, wherein the phosphor layer has a structure of a film and is formed on the light-emergent face of the substrate by one of attachment and coating.

11. The LED package structure as described in claim 1, wherein values of the wavelength of the lights emitted by the layers gradually decrease along a direction away from the substrate.

12. The LED package structure as described in claim 11, wherein the phosphor layer comprises a first layer formed on the light-emergent face, a second layer formed on the first layer, and a third layer formed on the second layer.

13. The LED package structure as described in claim 12, wherein the first layer comprises a first phosphorous compound whereby the first layer emits red light, the second layer comprises a second phosphorous compound whereby the second layer emits green light, and the third layer comprises a third phosphorous compound whereby the third layer emits blue light.

14. The LED package structure as described in claim 1, wherein a height of the housing is equal to that of the LED chip.

* * * * *